United States Patent
Wu et al.

(10) Patent No.: US 8,329,547 B2
(45) Date of Patent: Dec. 11, 2012

(54) SEMICONDUCTOR PROCESS FOR ETCHING A RECESS INTO A SUBSTRATE BY USING AN ETCHANT THAT CONTAINS HYDROGEN PEROXIDE

(75) Inventors: Chun-Yuan Wu, Yunlin County (TW); Chiu-Hsien Yeh, Tainan (TW); Chin-Cheng Chien, Tainan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 259 days.

(21) Appl. No.: 12/841,174

(22) Filed: Jul. 22, 2010

(65) Prior Publication Data
US 2012/0021583 A1    Jan. 26, 2012

(51) Int. Cl.
*H01L 21/306* (2006.01)

(52) U.S. Cl. .. 438/300; 438/504; 438/753; 257/E21.219
(58) Field of Classification Search .................... 438/750
See application file for complete search history.

(56) References Cited

U.S. PATENT DOCUMENTS

| 6,946,350 | B2 | 9/2005 | Lindert | |
|---|---|---|---|---|
| 7,557,396 | B2 * | 7/2009 | Ando | 257/288 |
| 2005/0095795 | A1 * | 5/2005 | Son et al. | 438/300 |
| 2006/0115949 | A1 | 6/2006 | Zhang | |
| 2010/0105184 | A1 * | 4/2010 | Fukuda et al. | 438/299 |

* cited by examiner

*Primary Examiner* — Stephen W Smoot
(74) *Attorney, Agent, or Firm* — Winston Hsu; Scott Margo

(57) ABSTRACT

A semiconductor process is disclosed. The semiconductor process includes the steps of: providing a substrate having a specific area defined thereon; and performing an etch process by using an etchant comprising $H_2O_2$ to etch the specific area for forming a recess.

17 Claims, 3 Drawing Sheets

SEMICONDUCTOR PROCESS FOR ETCHING A RECESS INTO A SUBSTRATE BY USING AN ETCHANT THAT CONTAINS HYDROGEN PEROXIDE

BACKGROUND OF THE INVENTION

1. Field of the Invention

The present invention relates to a semiconductor process, and more particularly, to a semiconductor process of using an etchant including $H_2O_2$ for etching a recess.

2. Description of the Prior Art

For decades, chip manufacturers have made metal-oxide-semiconductor (MOS) transistors faster by making them smaller. As the semiconductor processes advance to very deep sub micron era such as 65-nm node or beyond, how to increase the driving current for MOS transistors has become a critical issue.

In order to improve device performance, crystal strain technology has been developed. Crystal strain technology is becoming more and more attractive as a means for getting better performance in the field of CMOS transistor fabrication. Putting a strain on a semiconductor crystal alters the speed at which charges move through that crystal. Strain makes CMOS transistors work better by enabling electrical charges, such as electrons, to pass more easily through the silicon lattice of the gate channel.

FIGS. 1-2 are schematic, cross-sectional diagrams illustrating a semiconductor process applying epitaxy technology in accordance with prior art. As shown in FIG. 1, a fabrication process for a semiconductor structure 10 includes the steps of first providing a substrate 12 and forming a gate structure 14 on the substrate 12. The gate structure 14 has a gate dielectric layer 14a, a gate electrode 14b, a spacer 14c and a cap layer 14d. An implantation process is performed to form a source/drain region at both sides of the spacer 14c within a specific region 16. A dry etch process is performed to the specific region 16 to form a recess having a predetermined depth (as shown in FIG. 1). A wet etch process is performed to the specific region 16 by using ammonia water as an etchant to form a V-shaped recess, as shown in FIG. 2. An epitaxial process is performed to form an epitaxial layer filled within the recess (not shown in FIG. 2).

It is should be noted that a recess etched by ammonia water has a V-shaped profile and the V-shaped profile typically results in circuit leakages and diminishes the electrical quality of the semiconductor device. Moreover, as the dimension of semiconductor devices scales down as the industry develops, the aforementioned issue of the recess profile affecting electrical property of the product also worsens substantially.

SUMMARY OF THE INVENTION

It is an objective of the present invention to provide a semiconductor process of using an etchant including $H_2O_2$ for forming a flat-bottomed recess.

It is another objective of the present invention to provide a semiconductor process of using an etchant including $NH_4OH/H_2O_2$ for forming a semiconductor device having well electrical quality.

According to a preferred embodiment of the present invention, a semiconductor process comprises: providing a substrate, having thereon a specific area is defined; and performing an etch process to etch the specific area for forming a recess by using an etchant including $H_2O_2$.

According to a preferred embodiment of the present invention, a semiconductor process is disclosed. The semiconductor process includes the steps of: providing a substrate having a specific area defined thereon; and performing an etch process by using an etchant comprising $H_2O_2$ to etch the specific area for forming a recess.

It is another aspect of the present invention to provide a semiconductor process having the steps of: providing a substrate; forming a gate structure on the substrate, wherein the edge of the gate structure defines a source/drain region within the substrate; performing an etch process by using an etchant comprising $NH_4OH/H_2O_2$ to etch the source/drain region for forming a flat-bottomed recess; and forming an epitaxial layer to fill the recess.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
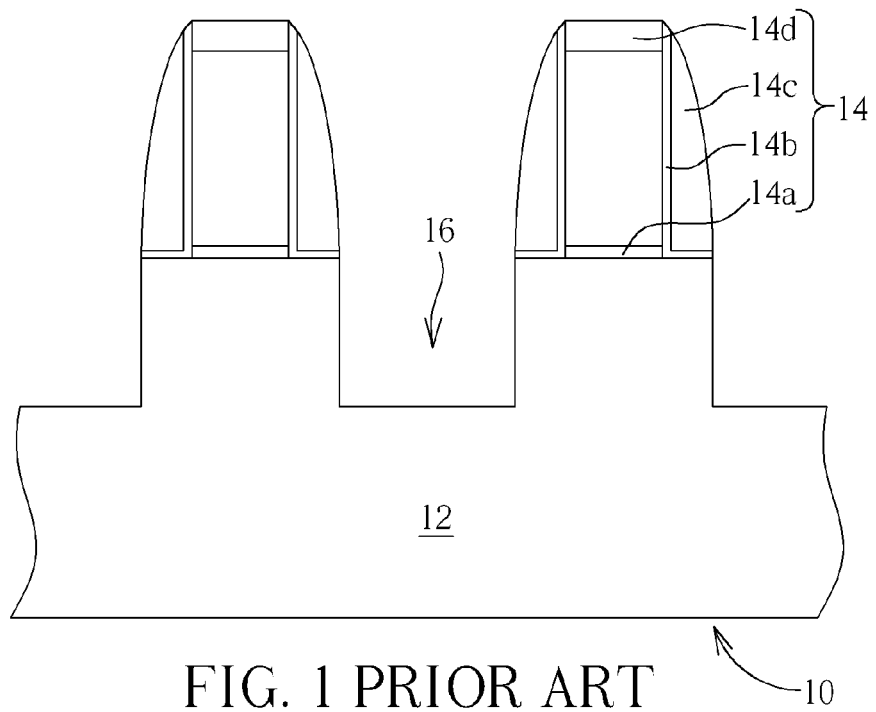
FIGS. 1-2 are schematic, cross-sectional diagrams illustrating a semiconductor process applying epitaxy technology in accordance with prior art.
Figure 2:
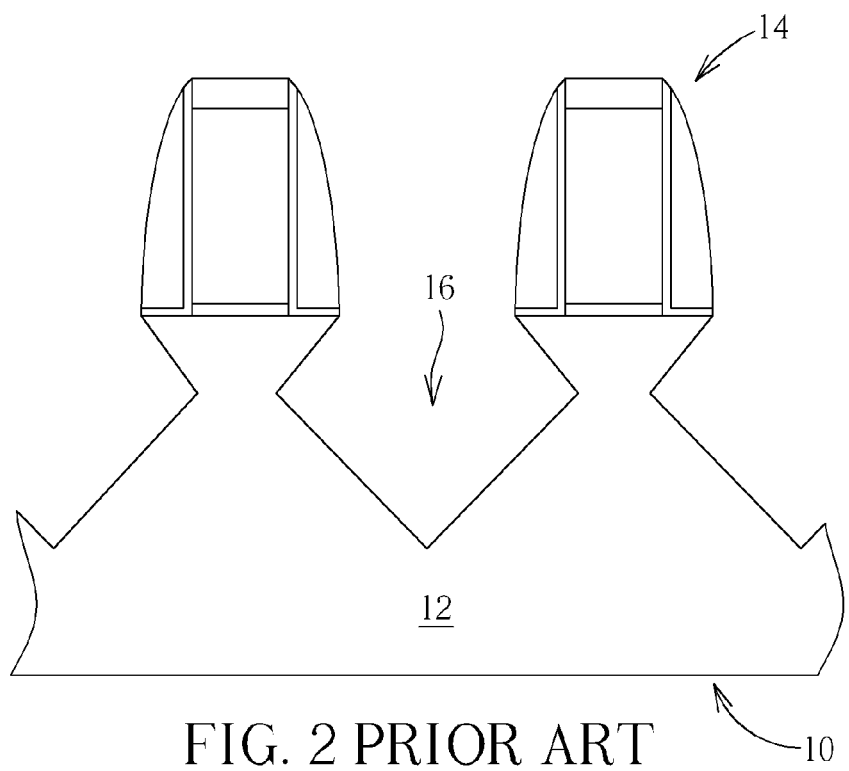
Figure 3:
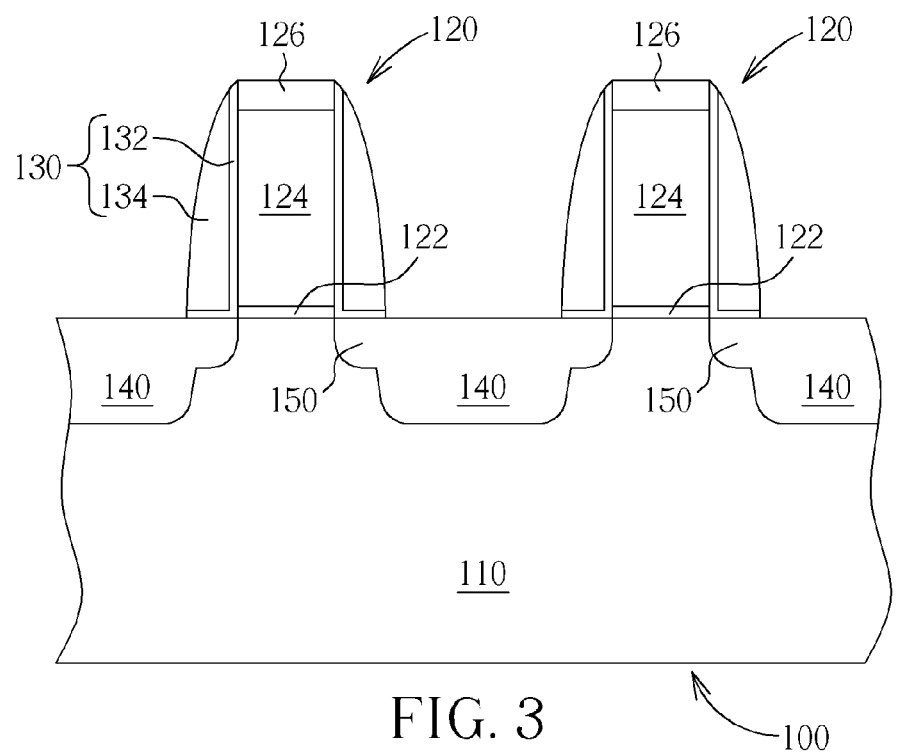
FIGS. 3-6 are schematic, cross-sectional diagrams illustrating a semiconductor process applying epitaxy technology in accordance with one preferred embodiment of the present invention.

FIGS. 3-6 are schematic, cross-sectional diagrams illustrating a semiconductor process applying epitaxial technology in accordance with a preferred embodiment of the present invention. As shown in FIG. 3, a substrate 110 is provided, in which the substrate 110 can be a doped or undoped single crystal silicon. A doped well and an insulating layer are formed sequentially on the substrate 110 to provide an insulation between adjacent devices or transistors (not shown). The insulating layer can be a trench insulation structure, and the fabrication thereof can be obtained by etching a recess and then depositing an oxide layer within the recess. The details which are not explained herein for the sake of brevity. In one example, the trench insulation structure can be a shallow trench isolation structure (STI), but not limited thereto.

A gate structure 120 is formed on the substrate 110. The gate structure 120 includes a gate dielectric layer 122 and a gate electrode 124. The fabricating method thereof includes performing a thermal or depositing process to comprehensively form a gate dielectric layer 122 on the substrate 110, and then, depositing a gate electrode 124 and a cap layer 126 sequentially on the gate dielectric layer 122. Thereafter, a pattern transfer process is performed to form the gate structure 120 by using a patterned photoresist, but not limited thereto. The gate dielectric layer 122 may be composed of silicon dioxide, silicon nitride, silicon oxynitride, a metal oxide compound, or other suitable high dielectric constant material. The material of the gate electrode 124 may be a heavily doped polycrystalline silicon, a metal or metal alloy such as titanium, tantalum, titanium nitride, tantalum nitride, tungsten or combinations of the above. The material of the cap layer 126 may be silicon nitride.

The gate structure 120 further includes a plurality of spacers 130 formed on both side of the gate structure 120. Thus, the edges of the spacers 130 define a specific area 140 within the substrate 110. In this embodiment, the specific area 140 is a source/drain region (the source/drain region represents the specific area 140 hereinafter, but the specific area 140 can also represent other areas needed to form a recess by the etch recesses). The spacers 130 may be a silicon nitride layer. The cap layer 126 and the spacers 130 can be utilized as a hard mask for an ion implantation process and an etch process performed thereafter to form the source/drain region. In this embodiment, the spacers 130 may be a multiple structure including an interior spacer 132 and an outer spacer 134.

After forming the spacers 132 adjacent to the gate structure 120, an ion implantation process is performed to form a lightly doped source/drain region 150 adjacent to two sides of the gate structure 120 within the substrate 110. Thereafter, the spacers 134 are formed around the spacers 132, and then, another ion implantation process is conducted by using the gate structure 120 and the spacers 134 as a hard mask to form the source/drain region 140. In addition to the above approach and sequence, it is known that the order for forming the gate structure 120, the spacers 130, the lightly doped source/drain region 150 and the source/drain region 140 could all be adjusted according to the demand of the product, which are all within the scope of the present invention. For example, if a gate last process is applied to the present invention, the gate electrode 124 of the gate structure 120 can only be a metal gate.

Figure 5:
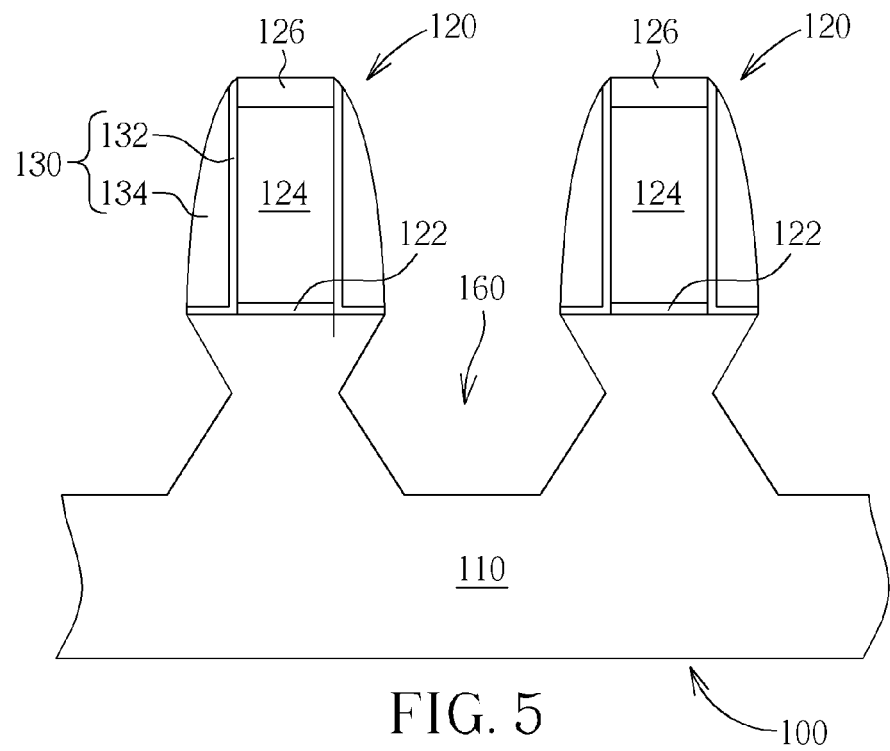

As shown in FIG. 5, after forming the source/drain region 140, an etch process is performed. The etch process preferably includes at least a wet etch process by using an etchant including $H_2O_2$ to remove the source/drain region 140 for forming a recess 160. It should be noted that the recess 160 etched by the etchant including $H_2O_2$ is preferably a flat-bottomed recess. In contrast to the conventional approach of using an etchant including $NH_4OH$, the etchant used in the present invention smoothes the V-shaped recess, thereby preventing semiconductor devices from circuit leakages. In other words, the utilization of an etchant including $H_2O_2$ can reduce the etching rate of etching down the substrate 110. In a preferred embodiment, the etchant is a solution including $NH_4OH/H_2O_2$, in which the volume percentage of the $H_2O_2$ is less than 1% of the volume percentage of the $NH_4OH$. Moreover, the pH value of the etchant is substantially above 10. The wet etch process can be performed under room temperature, and the temperature of the wet etch process ranges preferably between 25 and 80° C. In one example, if the substrate 110 were a silicon substrate, and the etching rate of the wet etch process for etching (100) and (110) surface of the silicon substrate is higher than the etching rate of the wet etch process for etching (111) surface of the silicon substrate. Therefore, a flat-bottomed recess is formed.

Figure 4:
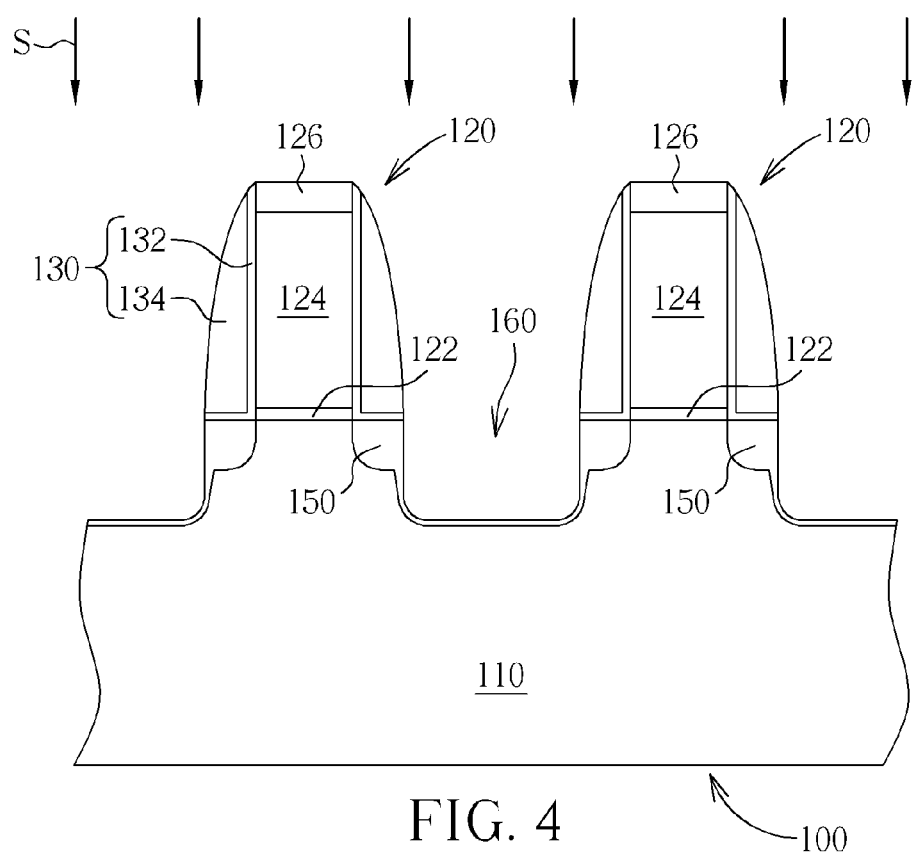

As shown in FIGS. 4-5, the etch process further includes a dry etch process (as shown in FIG. 4) and a wet etch process (as shown in FIG. 5. The dry etch process S, such as plasma etch process, is performed before the wet etch process for removing the source/drain region 140. In a preferred embodiment, because of the higher etching rate of the dry etch process S, the process S can be performed first for etching the substrate 110 to a predetermined depth. After that, a wet etch process can be carried out by using an etchant including $NH_4OH/H_2O_2$ for forming the flat-bottomed recess 160. This not only reduces the overall etching time, but also lowers the cost and utilization of the etchant substantially.

Figure 6:
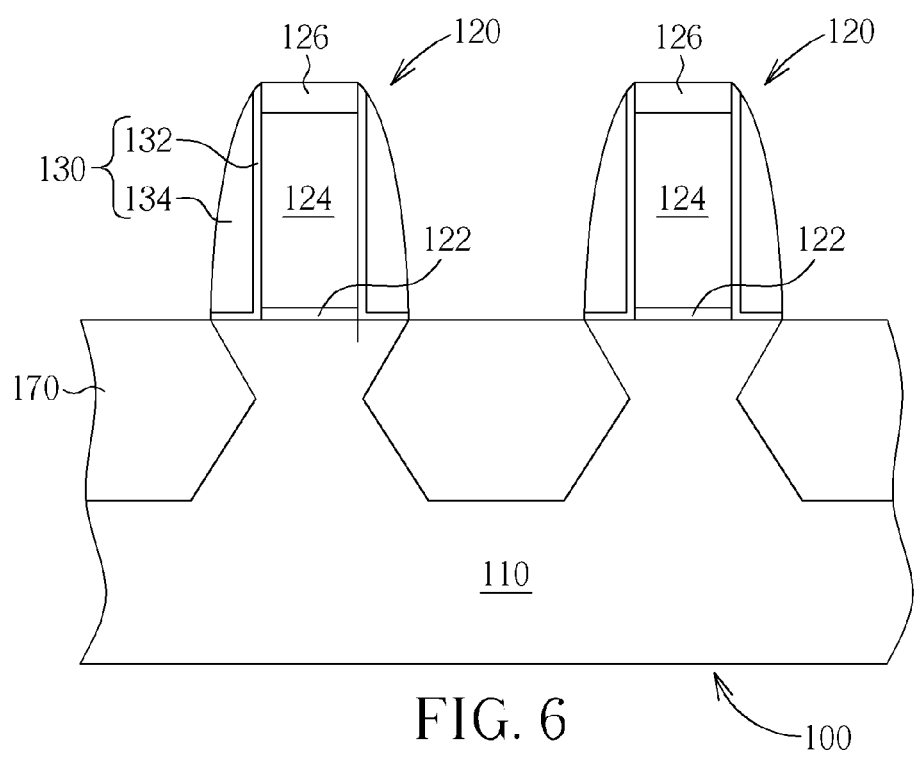

As shown in FIG. 6, after forming the recess 160, an epitaxial process is performed to form an epitaxial layer 170 in the recess 160. The epitaxial layer 170 may be a silicon-germanium epitaxial layer or a silicon-carbide epitaxial layer, for example.

In an embodiment, the semiconductor process of the present invention further includes a cleaning process performed before the etch process. The cleaning process preferably using a dilute solution of DHF and deionized water is carried out to remove a native oxide layer from the surface of the substrate 110 before the etch process is performed.

Moreover, the semiconductor process of the present invention could also perform another cleaning process before the epitaxial layer and after the recess 160 is formed to clean the recess 160 by removing particles, such as residues remained or attached in the recess 160 and on the substrate 110 after the etch process. The cleaning process involves the utilization of a standard clean step 1 (SC-1) which includes $NH_4OH/H_2O_2/H_2O$ (volume ratio is 1:1:5 to 1:2:7), and the cleaning temperature is preferably between 75~85° C. The standard clean step 1 can oxide silicon surfaces of substrates and recesses, generates oxide layers, and then hydrolyes and dissolutes the generated oxide layers by $NH_4OH$, to remove the particles adhered on the oxide layers. Furthermore, the particles and the surfaces of the wafer have negative charges, so the particles can be removed by double layer repulsive force. In the component of the standard clean step 1, the volume percentage of the $H_2O_2$ is higher than the volume percentage of the $NH_4OH$. As the temperature of the cleaning solution is up to 75~85° C., the kinetic energy of the attached particles increases so as to detach particles from the surfaces of the wafer.

The embodiment shown in FIG. 3-6 preferably forms a flat-bottomed recess 160 within the source/drain region 140 by using an etchant including $NH_4OH/H_2O_2$ to prevent circuit leakage issue. The semiconductor process of the present invention can also be used in other structures formed on the substrate 110 for forming a recess. More particularly, the semiconductor process of the present invention is most suitable for forming structures with a flat-bottomed recess.

Overall, a semiconductor process using an etchant including $H_2O_2$ is provided. In particular, a semiconductor process using an etchant including $NH_4OH/H_2O_2$ to form a recess is provided. The semiconductor process can reduce the rate of etching down a substrate. For example, the etching rate of the wet etching process for etching (100) and (110) surface of a silicon substrate is higher than the etching rate of the wet etching process for etching (111) surface of a silicon substrate. As a result, a flat-bottomed recess is formed to prevent semiconductor devices from circuit leakages and improve devices' electrical quality.

Those skilled in the art will readily observe that numerous modifications and alterations of the device and method may be made while retaining the teachings of the invention.

What is claimed is:

1. A semiconductor process, comprising:
providing a substrate, wherein the substrate comprises a silicon substrate and has a specific area defined thereon; and
performing an etch process which comprises a wet etch process by using an etchant comprising $H_2O_2$ to etch the specific area for forming a recess, wherein the etching rate of the wet etch process for etching (100) and (110) surface of the silicon substrate is greater than the etching rate of the wet etch process for etching (111) surface of the silicon substrate.

2. The semiconductor process of claim 1, wherein the etchant further comprises $NH_4OH$, and the volume percentage of the $H_2O_2$ is less than 1% of the volume percentage of the $NH_4OH$.

3. The semiconductor process of claim 2, wherein the pH value of the etchant is substantially above 10, and the temperature of the wet etch process ranges between 25° C. and 80° C.

4. The semiconductor process of claim 1, wherein the etch process further comprises performing a dry etch process before the wet etch process.

5. The semiconductor process of claim 1, wherein the specific area comprises a source/drain region.

6. The semiconductor process of claim 1, further comprising an epitaxial process for forming an epitaxial layer within the recess.

7. The semiconductor process of claim 1, wherein the recess comprises a flat-bottomed recess.

8. The semiconductor process of claim 1, further comprising performing a cleaning process before the etch process for removing an oxide layer formed on the surface of the substrate.

9. The semiconductor process of claim 1, further comprising performing a cleaning process for cleaning the recess, wherein the cleaning solution of the cleaning process comprises $NH_4OH/H_2O_2$, and the volume percentage of the $H_2O_2$ is higher than or equal to the volume percentage of the $NH_4OH$.

10. A semiconductor process, comprising:
    providing a substrate, wherein the substrate comprises a silicon substrate;
    forming a gate structure on the substrate, wherein the edge of the gate structure defines a source/drain region within the substrate;
    performing an etch process which comprises a wet etch process by using an etchant comprising $NH_4OH/H_2O_2$ to etch the source/drain region for forming a flat-bottomed recess, wherein the etching rate of the wet etch process for etching (100) and (110) surface of the silicon substrate is higher than the etching rate of the wet etch process for etching the (111) surface of the silicon substrate; and
    forming an epitaxial layer to fill the recess.

11. The semiconductor process of claim 10, wherein the volume percentage of the $H_2O_2$ is less than 1% of the volume percentage of the $NH_4OH$.

12. The semiconductor process of claim 11, wherein the pH value of the etchant is substantially above 10, and the temperature of the wet etch process ranges between 25° C. and 80° C.

13. The semiconductor process of claim 10 wherein the etch process further comprises performing a dry etch process before the wet etch process.

14. The semiconductor process of claim 10, further comprising performing at least an implantation process to the source/drain region, before the etch process.

15. The semiconductor process of claim 10, wherein the epitaxial layer comprises a silicon germanium layer or a silicon carbide layer.

16. The semiconductor process of claim 10, further comprising performing a cleaning process before the etch process for removing an oxide layer from the surface of the substrate.

17. The semiconductor process of claim 10, further comprising performing a cleaning process for cleaning the recess, wherein the cleaning solution of the cleaning process comprises $NH_4OH/H2O_2$, and the volume percentage of the $H_2O_2$ is higher than or equal to the volume percentage of the $NH_4OH$.

* * * * *